United States Patent
Arai

(10) Patent No.: US 7,202,865 B2
(45) Date of Patent: Apr. 10, 2007

(54) IMAGE SIGNAL REPEATER APPARATUS, IMAGE DISPLAY APPARATUS WITH IMAGE SIGNAL REPEATER FUNCTION, AND METHOD OF CONTROLLING SAME

(75) Inventor: Yutaka Arai, Atsugi (JP)

(73) Assignee: NEC-Mitsubishi Electric Visual Systems Corporation, Tokyo (JP)

( * ) Notice: Subject to any disclaimer, the term of this patent is extended or adjusted under 35 U.S.C. 154(b) by 675 days.

(21) Appl. No.: 10/720,549

(22) Filed: Nov. 24, 2003

(65) Prior Publication Data

US 2004/0119888 A1 Jun. 24, 2004

(30) Foreign Application Priority Data

Nov. 28, 2002 (JP) ............................ 2002-345624

(51) Int. Cl.
*G09G 5/00* (2006.01)
(52) U.S. Cl. ..................... 345/213; 345/204; 345/211
(58) Field of Classification Search ................. 345/87, 345/100, 204, 211–213
See application file for complete search history.

(56) References Cited

U.S. PATENT DOCUMENTS

| | | | | |
|---|---|---|---|---|
| 5,917,461 | A * | 6/1999 | Sakami et al. | 345/29 |
| 6,407,723 | B1 * | 6/2002 | Okuno et al. | 345/3.2 |
| 6,778,170 | B1 * | 8/2004 | Shu et al. | 345/213 |
| 6,812,915 | B2 * | 11/2004 | Yamaguchi | 345/99 |
| 6,831,618 | B1 * | 12/2004 | Suzuki et al. | 345/60 |
| 6,831,634 | B1 * | 12/2004 | Shigeta | 345/213 |
| 6,924,796 | B1 * | 8/2005 | Someya et al. | 345/213 |
| 2001/0045947 | A1 * | 11/2001 | Nishitani et al. | 345/213 |
| 2001/0048432 | A1 * | 12/2001 | Taniai et al. | 345/213 |
| 2002/0075255 | A1 * | 6/2002 | Baek et al. | 345/212 |
| 2004/0085309 | A1 * | 5/2004 | Wang et al. | 345/213 |

FOREIGN PATENT DOCUMENTS

| | | |
|---|---|---|
| JP | 06-338880 | 12/1994 |
| JP | 07-131492 | 5/1995 |
| JP | 08-191294 | 7/1996 |
| JP | 10-051358 | 2/1998 |
| JP | 10-285150 | 10/1998 |
| JP | 10-327158 | 12/1998 |
| JP | H11-284671 | 10/1999 |
| JP | 11-355280 | 12/1999 |
| JP | 2002-217715 | 8/2002 |

* cited by examiner

*Primary Examiner*—Richard Hjerpe
*Assistant Examiner*—Kimnhung Nguyen
(74) *Attorney, Agent, or Firm*—Scully, Scott, Murphy & Presser, P.C.

(57) ABSTRACT

There is provided an image signal repeater apparatus with a simple construction, which can prevent the accumulation of jitter even if the image signal repeater apparatuses are connected in multiple stages, and which enables the reception of image signals of various frequencies. This comprises: an image signal device 22 which receives a composite image signal, comprising an image signal composed of multiple frames and a synchronization signal corresponding to the image signal, and then outputs each signal as a composite image signal Di; an image signal recovery device 26 which internally generates a clock signal Cl which corresponds to a frequency of a synchronous signal in the composite image signal Di, but which is not synchronized with the image signal in the composite image signal Di, and recovers the input image signal Di using the clock signal Cl, to recover an image signal Dr, and an image signal transmission device 27 which converts the recovered image signal Dr output from the image signal recovery device 26, to a digital transmission signal, and outputs the converted signal.

16 Claims, 7 Drawing Sheets

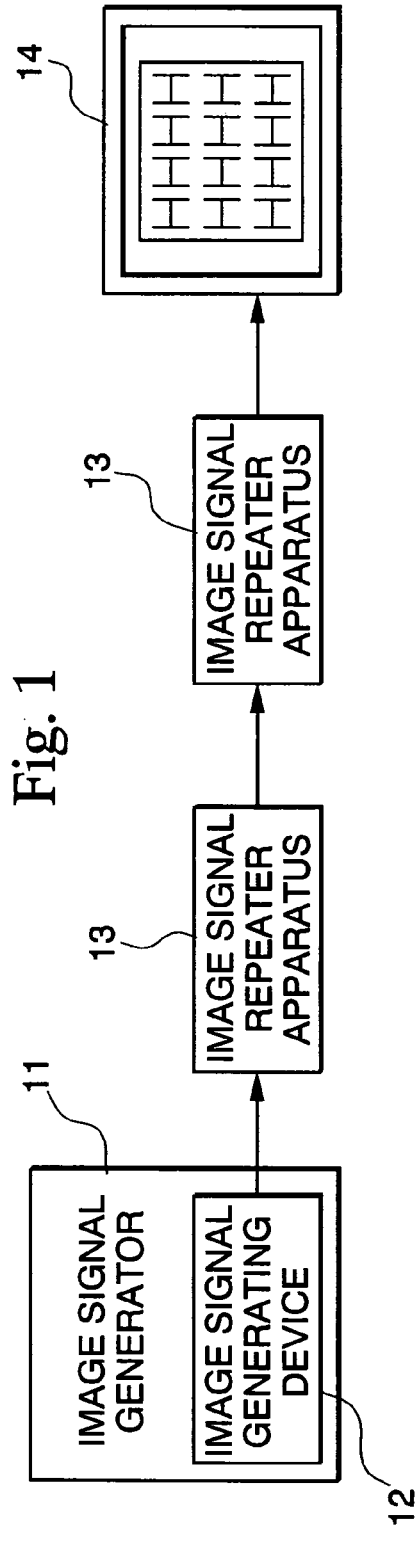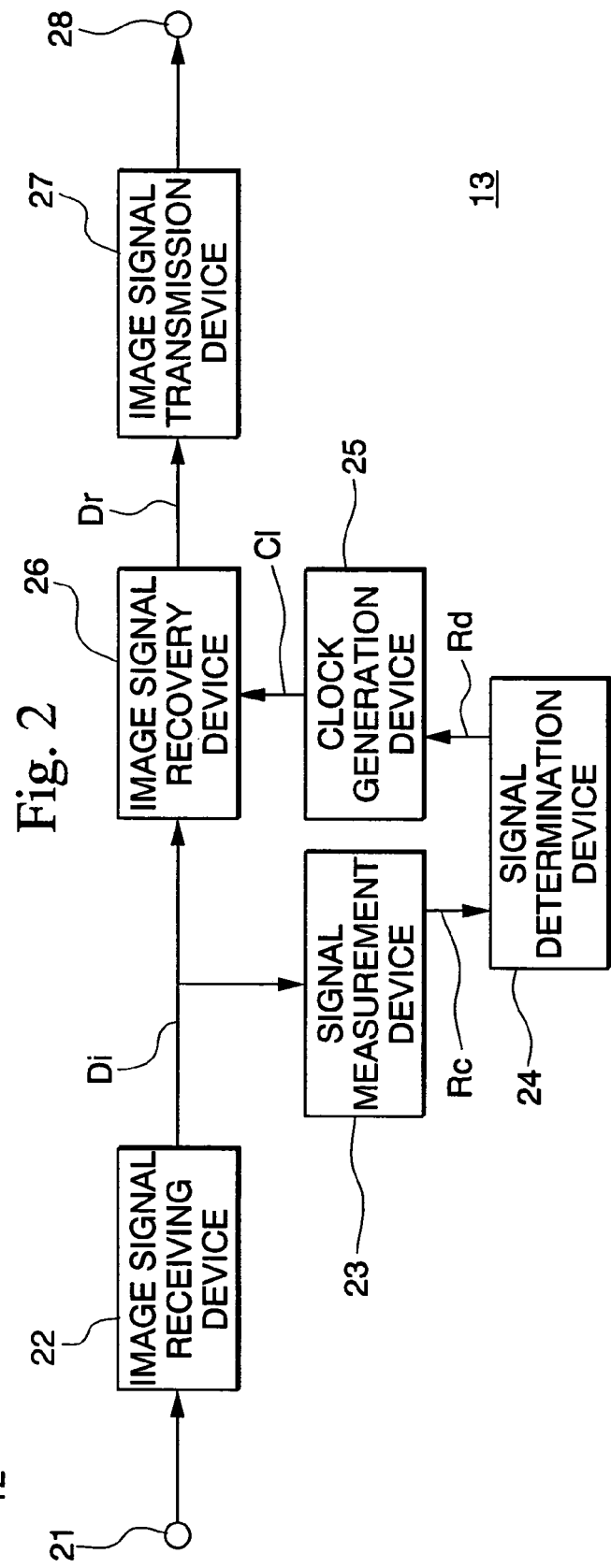

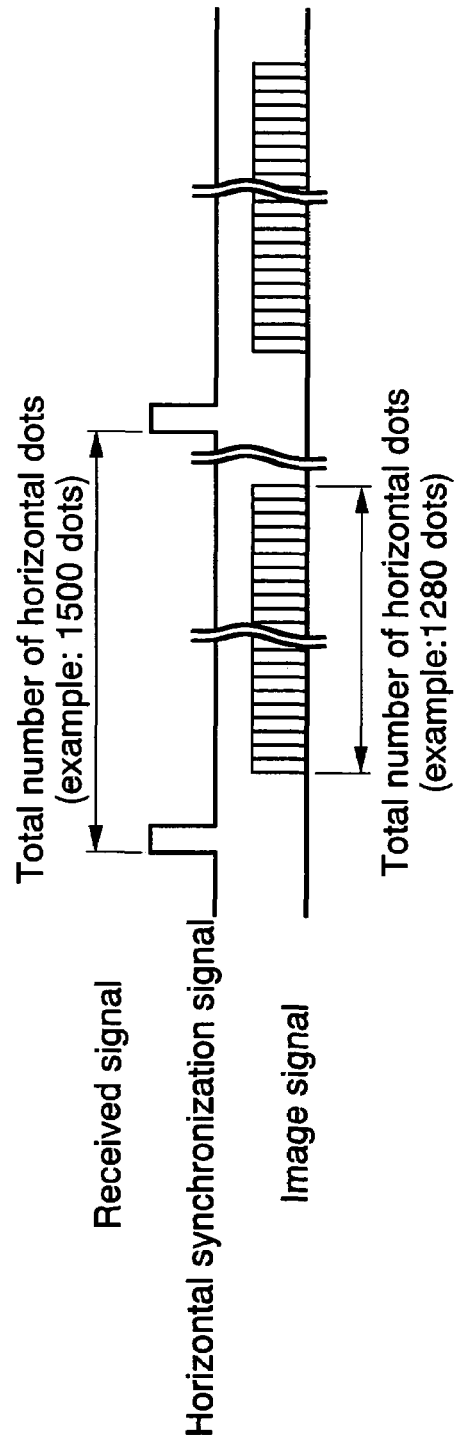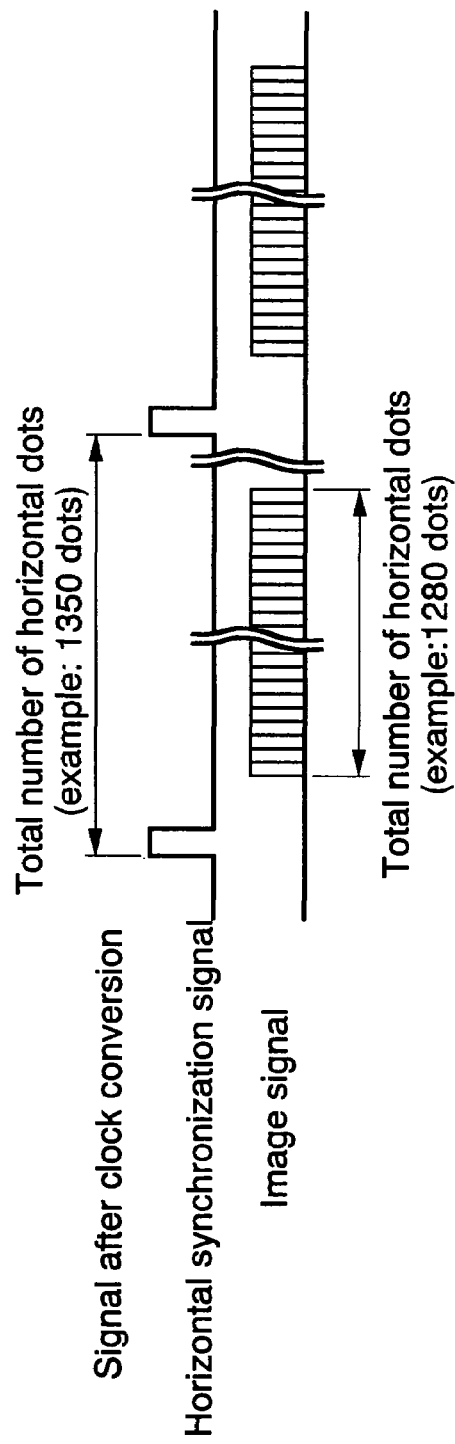

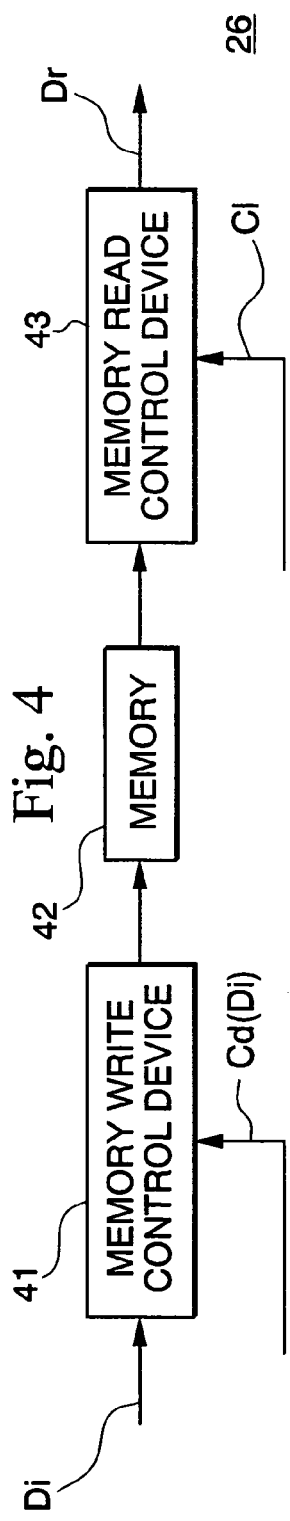
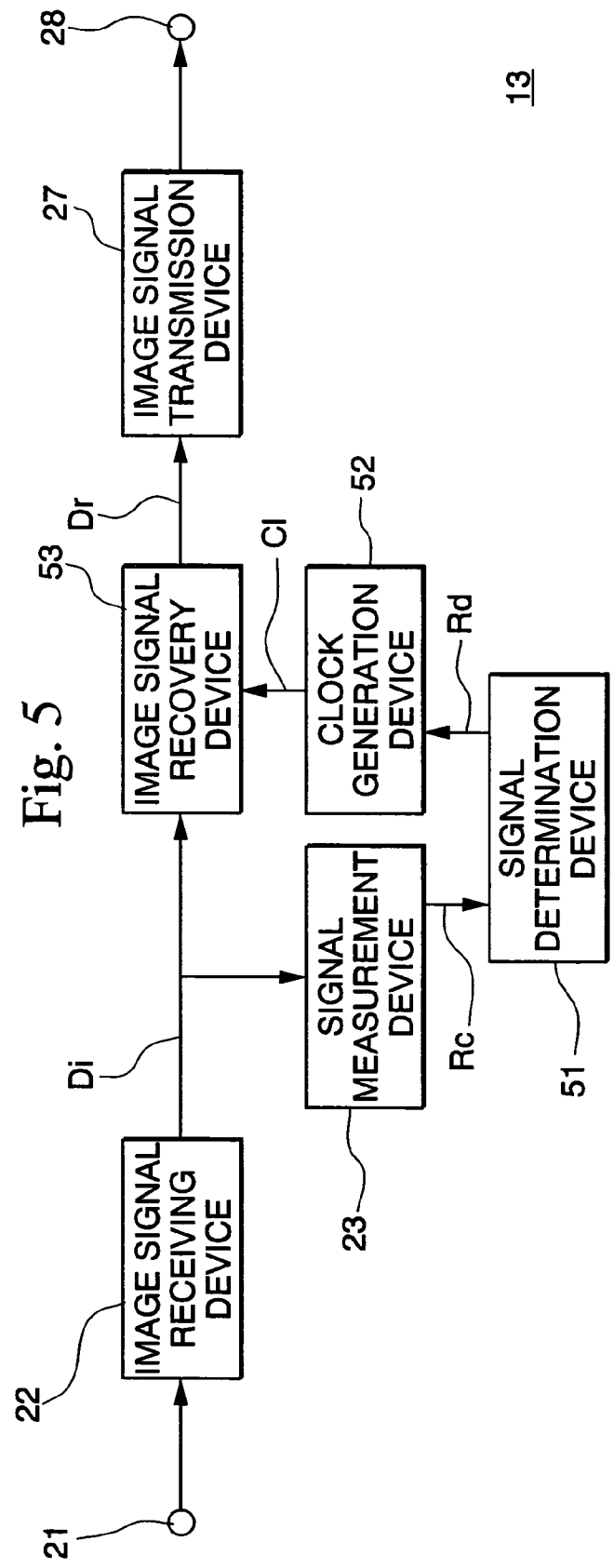

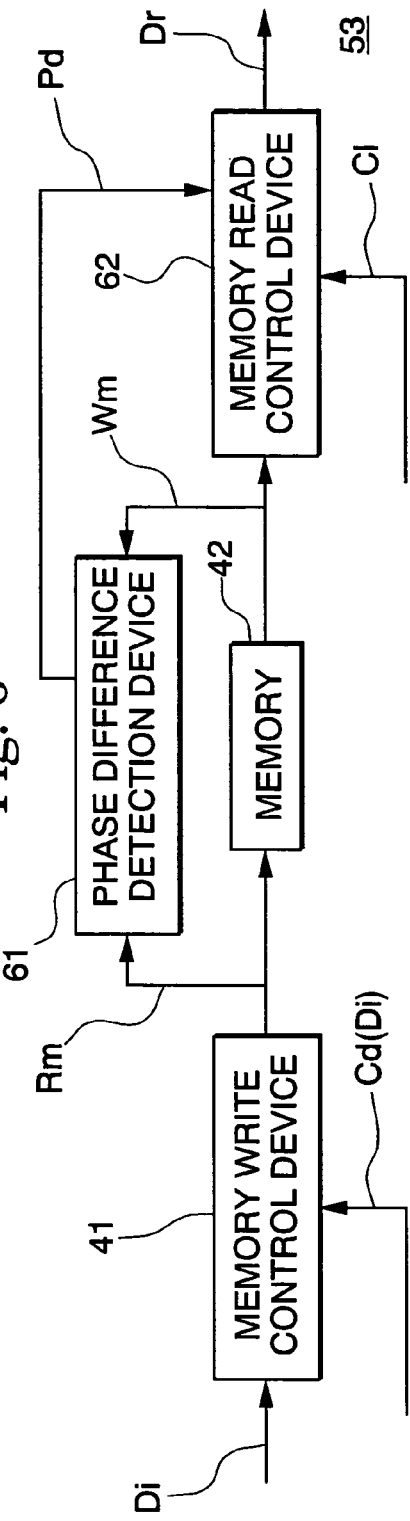
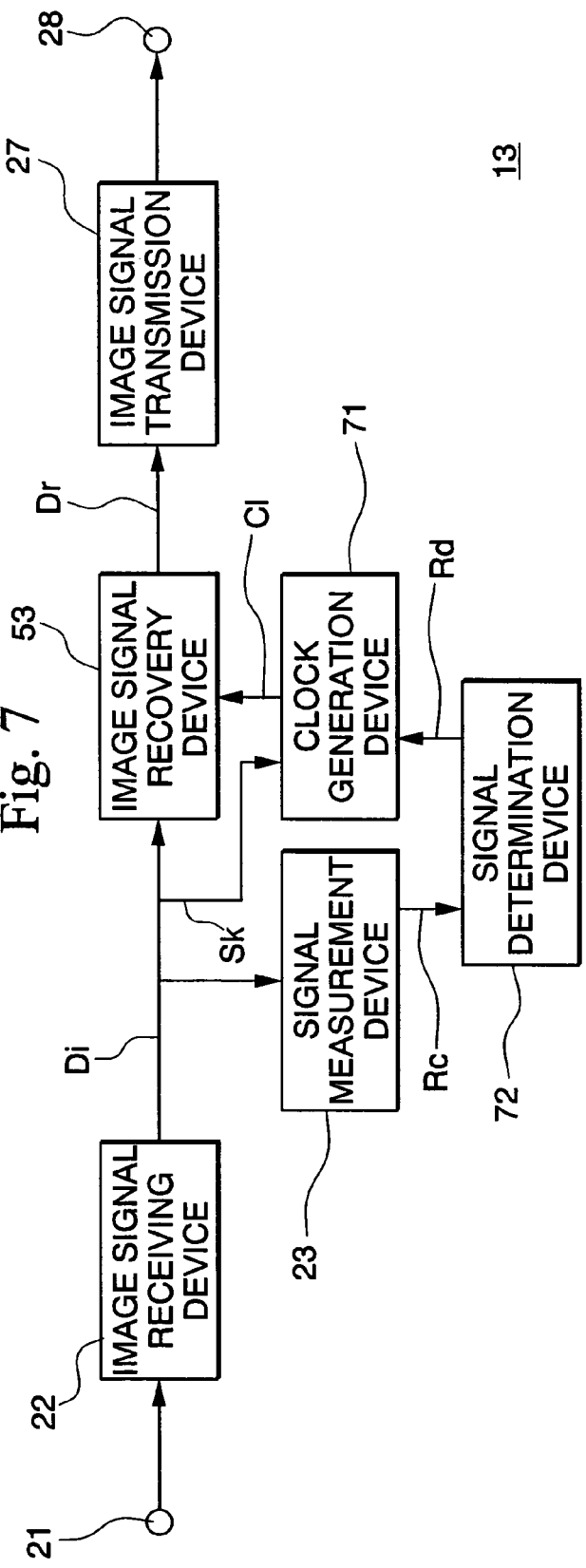

IMAGE SIGNAL REPEATER APPARATUS, IMAGE DISPLAY APPARATUS WITH IMAGE SIGNAL REPEATER FUNCTION, AND METHOD OF CONTROLLING SAME

BACKGROUND OF THE INVENTION

1. Field of the Invention

The present invention relates to an image signal repeater apparatus which receives an image signal having a predetermined format which is used by a personal computer (hereafter referred as a PC), from an image signal generator such as a PC, and then recovers the image signal in the predetermined format and outputs this. The present invention also relates to an image display apparatus with an image signal repeater function which in addition to having the function of this image signal repeater apparatus, is for displaying the received signal on a display device, for example an LCD, CRT, plasma display or electroluminescent display, and to a method of controlling the image signal repeater apparatus and the image display apparatus.

2. Background Art

FIG. 1 shows an image display system commonly used to transmit an image signal over long distances. In FIG. 1, this image display system comprises; an image signal generator 11, an image signal generating device 12 contained in the image signal generator 11, and also comprises either one or a plurality of image signal repeater apparatuses 13 and image display apparatuses 14.

In the diagram the image signal generator 11 has an internal image signal generating device 12, and outputs an image signal created by the image signal generator. The output image signal is relayed by the image signal repeater apparatuses 13, and displayed on the image display apparatus 14.

FIG. 11 is a block diagram showing the internal construction of a conventional image signal repeater apparatus 13 used in the image display system described above. In FIG. 11, this image signal repeater apparatus 13 comprises a receiving terminal 111, an image signal receiving device 112, a clock regeneration device 115 contained inside the image signal receiving device 112, an image signal transmission device 113, and an image signal output terminal 114.

The operation of the image signal repeater apparatus 13 shown in FIG. 11 is described below with reference to FIG. 1 and FIG. 11. As shown in FIG. 1, the image signal output from the image signal generator 11 is input to the image signal repeater apparatus 13. As shown in FIG. 11, the image signal input to the image signal repeater apparatus 13 is input to the image signal receiving device 112 via an input connector 111.

To enable the image signal receiving device 112 to reliably recover the received image signal, such a device generally comprises a clock regeneration device 115 incorporating a phase lock loop (hereafter referred to as a PLL). The image signal receiving device 112 receives the image signal reliably according to the clock recovered by the clock regeneration device, and outputs the recovered image signal to the image signal transmission device 113. The image signal transmission device 113 then outputs the image signal received from the image signal receiving device 112, in a predetermined format. As shown in FIG. 1, it is possible to transmit the image signal over longer distances by connecting image signal repeater apparatuses 13 in multiple stages.

Furthermore, FIG. 12 is a block diagram showing the section of the repeater apparatus proposed in Japanese Unexamined Patent Application, First Publication No. Hei 10-51358 (patent document 1) which is responsible for repeating the image signal. In FIG. 12, this image signal repeater apparatus 13 comprises a receiving terminal 121, a demodulation section 122, an image memory 123, a modulation section 124, a clock generation section 125, and an output terminal 126.

Next, the operation of the image signal repeater apparatus 13 shown in FIG. 12 is described with reference to FIG. 1 and FIG. 12. The image signal generating device 12 shown in FIG. 1 generates an analog signal which is modulated to aid transmission, and outputs the signal as output from the image signal generator 11. As shown in FIG. 12, the output image signal is input to the demodulation section 122, demodulated, and written to the image memory 123.

The image data written to the image memory 123 is read out in synchronization with the clock generated by the clock generation section 125, and output to the modulation section 124. The modulation section 124 then modulates the received image signal in synchronization with the clock generated by the clock generation section 125, and outputs the signal.

Next, several examples of other related background art are described in brief. An example of a conventional repeater apparatus is a receiver apparatus used to recover an unstable signal component such as a television signal, wherein the sampling clock is determined based on several calculations (see patent document 2, for example). Another example is a repeater apparatus in which a transmission signal is received and recovered by a PLL which operates at a clock set to N times the transmit clock, and is then recovered by a PLL which operates at a clock set to M times that of the transmit clock (where N<M and M, N are natural numbers) and then transmitted (see patent document 3, for example).

Furthermore, there are transmitter-receivers which perform data transmission over an ATM (Asynchronous Transfer Mode) network by using a timestamp for correction based on the network clock, thus ensuring the corrected recovered clock is generated (patent document 4, for example). Furthermore, another example of conventional technology is an apparatus which instead of using a PLL, temporarily stores data received via the transmission path in a buffer, and keeps the average rate of data transmission constant by switching the speed of the read clock (see patent document 5, for example).

Furthermore, various constructions are proposed for synchronizing conventional clock generations circuits with an input signal, for the purpose of improving performance and the like (see patent documents 6 to 8, for example).

[Patent Document 1]
Japanese Unexamined Patent Application, First Publication No. Hei 10-51358 (pages 3 to 4, FIG. 1)

[Patent Document 2]
Japanese Unexamined Patent Application, First Publication No. Hei 6-338880 (pages 3 to 4, FIG. 1)

[Patent Document 3]
Japanese Unexamined Patent Application, First Publication No. Hei 7-131492 (page 2, FIG. 1)

[Patent Document 4]
Japanese Unexamined Patent Application, First Publication No. Hei 11-355280 (page 5, FIG. 1)

[Patent Document 5]
Japanese Unexamined Patent Application, First Publication No. Hei 10-327158 (page 3, FIG. 1)

[Patent Document 6]
Japanese Unexamined Patent Application, First Publication No. 2002-217715 (page 4, FIG. 2)

[Patent Document 7]
Japanese Unexamined Patent Application, First Publication No. Hei 8-191294 (pages 5 to 6, FIG. 5)
[Patent Document 8]
Japanese Unexamined Patent Application, First Publication No. Hei 10-285150 (pages 8 to 9. FIG. 1)

An image signal repeater apparatus 13 such as that shown in FIG. 11 does not include a function for reducing distortion in the time direction, contained in the clock of the received image signal (referred to as jitter below), and may even cause jitter internally because of the noise within the apparatus. When image signal repeater apparatuses 13 are connected in multiple stages as shown in FIG. 1, the jitter in the clock accumulates and increases with the increase in stages.

Furthermore, the clock regeneration device 115 shown in FIG. 11 typically uses a PLL for clock regeneration, but when the PLL is used there is a limit to the phase range which can be locked, and therefore the phase cannot be locked properly once the jitter exceeds a certain amount.

In the conventional construction shown in FIG. 12, since a clock which is not synchronized with the input signal is used in reading from memory and in signal modulation, jitter does not accumulate when apparatuses are connected in multiple stages. Hence, the above problem does not occur. However, since the internally generated clock is fixed at a certain value, regardless of the clock of the received signal, such an apparatus cannot receive image signals that can have a variety of frequencies, such as signals output by a PC. Furthermore, since an analog method is adopted for signal modulation and demodulation, then with multistage connection, modulation errors are commonplace, making it increasingly difficult to reliably recover the original signal as the number of stages increases.

Furthermore, with the sampling clock regeneration method described in patent document 2, the sampling clock is determined based on multiple calculations. Therefore there is a problem in that high speed signal determination is difficult, and the circuitry and configuration is complicated.

Moreover, in the multi-stage relay system described in patent document 3, if jitter is present in the input signal, a problem occurs in that the PLL itself follows the jitter, failing to reduce the jitter sufficiently. Furthermore, since the PLL is operating constantly, if the transmission signal is an image signal composed of multiple frames, the effect of jitter is also apparent within the image period.

Furthermore, in the data transmission system shown in patent document 4, since a clock called a network clock, which is separate from the internally generated clock, is used, specific architecture is required for that purpose.

Moreover, in the clock generation apparatus shown in patent document 5, the internally generated clock is not switched according to the original clock of the input signal, and is instead switched according to the amount of buffered data. Consequently, it is difficult to perform control in which frequency switching is performed in accordance with a specific signal, for example it is difficult to accurately control the generation of a synchronization signal corresponding to an image signal composed of multiple frames.

SUMMARY OF THE INVENTION

The present invention addresses the aforementioned problems, with the object of preventing the accumulation of jitter when image signal repeater apparatuses are connected in multiple stages, to prevent the PLL from operating abnormally, to enable the reception of image signals of various frequencies, and to transmit a good quality image signal in which deterioration of the original image signal is kept to a minimum. In other words, in an image display system as shown in FIG. 1, the object of the invention is to enable the connection of image signal repeater apparatuses in multiple stages, to enable the image to be accessed at any relay point by providing image display apparatuses which include the image signal repeater function described above, via image signal repeater apparatuses which enable image signal transmission over long distances, and also to provide a control method suited to these apparatuses. Another object of the present invention is to simplify the construction of such image signal repeater apparatuses and image display apparatuses having image signal repeater functions.

In order to solve the problems described above, the present invention comprises: an image signal receiving section which receives a composite image signal, comprising an image signal composed of multiple frames and a synchronization signal corresponding to the image signal, and then outputs each signal; a clock replacing section which replaces a clock signal which is based on a synchronization signal corresponding with an image signal output by the image signal receiving section, with an internally regenerated replacement clock signal, and recovers an input image signal using the replacement clock signal; and an image signal transmission section which converts the recovered image signal output from the clock replacing section, to a digital transmission signal, and outputs the converted signal.

Furthermore, in the present invention, the clock replacing section comprises; a signal measurement device which measures the characteristics of the input image signal, a signal determination device which based on the results from the signal measurement device determines a frequency for the replacement clock signal to recover the image signal, a clock generation device which generates a replacement clock signal for recovering the image signal according to the results of the signal determination device, and an image signal recovery device which recovers the input image signal using the replacement clock signal generated by the clock generation device. In the present invention, the image signal recovery device comprises; a memory device which stores an image signal, a memory write device which writes the image signal to the memory device in synchronization with a clock signal which is based on the synchronization signal corresponding with the image signal, and a memory read device which reads the image signal from the memory device in synchronization with the replacement clock signal generated by the clock generation device. In the present invention, a reduction in a dot clock rate is realized by reducing a total number of dots when read from memory relative to a total number of horizontal dots when written to memory by the image signal recovery device.

Moreover, in the present invention, the clock replacing section comprises; a signal measurement device which measures the characteristics of the input image signal, a signal determination device which based on the results from the signal measurement device determines the frequency of a replacement clock signal for recovering the image signal, a clock generation device which generates a replacement clock signal for image signal recovery according to the results of the signal determination device, an image signal recovery device which recovers an input image signal using the replacement clock generated by the clock generation device, and a phase difference detection device which detects a phase difference between the input image signal and the recovered image signal, and outputs a control signal corresponding to the phase difference.

Furthermore, the present invention controls based on the results of the phase difference detection section so as to reduce the phase difference, by adjusting the total number of horizontal dots or the total number of vertical lines or the frequency of a dot clock so as to eliminate any generated phase difference.

Moreover, in the present invention, the clock generation device comprises: a phase comparison device which compares a phase of the input synchronization signal and a phase of a signal corresponding to the replacement clock signal; a clock oscillation device which oscillates the replacement clock signal regenerated in accordance with the results of the phase comparison device; and a frequency dividing device which divides the replacement clock signal generated in the clock oscillation device and transmits the result to the phase comparison device, and phase comparison is only performed by the phase comparison device within blanking periods, where there is no image data.

Furthermore, in the present invention, the clock generation device comprises: a phase comparison device which compares a phase of the input synchronization signal and a phase of a signal corresponding to the replacement clock signal; a clock oscillation device which oscillates the replacement clock signal regenerated in accordance with the results of the phase comparison device; and a frequency dividing device which divides the replacement clock signal generated in the clock oscillation device and transmits the result to the phase comparison device, and phase comparison is only performed by the phase comparison device within blanking periods, where there is no image data.

Moreover, the present invention comprises: an image signal receiving section which receives a composite image signal, comprising an image signal composed of multiple frames and a synchronization signal corresponding to the image signal, and then outputs each signal; a clock replacing section which replaces a clock signal which is based on a synchronization signal corresponding with an image signal output by the image signal receiving section, with an internally generated replacement clock signal, and recovers an input image signal using the replacement clock signal; an image signal display section which displays the image signal output from the clock replacing section, on an image display device, and an image signal transmission section which converts the recovered image signal output from the clock replacing section, to a digital transmission signal, and outputs the converted signal.

Furthermore, in the present invention, the clock replacing section comprises; a signal measurement device which measures the characteristics of the input image signal, a signal determination device which based on the results from the signal measurement device determines a frequency for the replacement clock signal to recover the image signal, a clock generation device which generates a replacement clock signal for recovering the image signal according to the results of the signal determination device, and an image signal recovery device which recovers the input image signal using the replacement clock signal generated by the clock generation device. In the present invention, the image signal recovery device comprises; a memory device which stores an image signal, a memory write device which writes the image signal to the memory device in synchronization with a clock signal which is based on the synchronization signal corresponding with the image signal, and a memory read device which reads the image signal from the memory device in synchronization with a replacement clock signal generated by the clock generation device.

Moreover, in the present invention, a reduction in a dot clock is realized by reducing a total number of dots when read from memory relative to a total number of horizontal dots when written to memory by the image signal recovery device.

Furthermore, in the present invention, the clock replacing section comprises; a signal measurement device which measures the characteristics of the input image signal, a signal determination device which based on the results from the signal measurement device determines the frequency of a replacement clock signal for recovering the image signal, a clock generation device which generates a replacement clock signal for image signal recovery according to the results of the signal determination device, an image signal recovery device which recover an input image signal using the replacement clock generated by the clock generation device, and a phase difference detection device which detects a phase difference between the input image signal and the recovered image signal, and outputs a control signal corresponding to the phase difference.

Moreover, the present invention controls based on the results of the phase difference detection section so as to reduce the phase difference, by adjusting the total number of horizontal dots or the total number of vertical lines or the frequency of a dot clock so as to eliminate any generated phase difference.

Furthermore, in the present invention, the clock generation device comprises: a phase comparison device which compares a phase of the input synchronization signal and a phase of a signal corresponding to the replacement clock signal; a clock oscillation device which oscillates the replacement clock signal regenerated in accordance with the results of the phase comparison device; and a frequency dividing device which divides the replacement clock signal generated in the clock oscillation device and transmits the result to the phase comparison device, and phase comparison is only performed by the phase comparison device within blanking periods, where there is no image data.

Moreover, in the present invention the clock generation device comprises: a phase comparison device which compares a phase of the input synchronization signal and a phase of a signal corresponding to the replacement clock signal; a clock oscillation device which oscillates the replacement clock signal regenerated in accordance with the results of the phase comparison device; and a frequency dividing device which divides the replacement clock signal generated in the clock oscillation device and transmits the result to the phase comparison device, and phase comparison is only performed by the phase comparison device within blanking periods, where there is no image data.

Furthermore, with the present invention, the image signal repeater apparatus, which receives an image signal having a predetermined format and then outputs that image signal, may comprise; an image signal receiving section which receives an image signal in a predetermined format suitable for signal transmission, converts the signal to a format that is easy to process, and then outputs the signal, a clock replacing section which switches the clock in the image signal output from the image signal receiving section to an internally generated clock, synchronizes the image signal to the switched clock and then recovers the image signal, and an image signal transmission section which converts the image signal output from the clock replacing section to a format suitable for signal transmission and outputs the signal.

Moreover, the image signal repeater apparatus of the present invention may employ a configuration in which the clock replacing section comprises; a signal measurement device which measures the characteristics of the clock signal included in the image signal output from the image signal receiving section, a signal determination device which determines the frequency of the clock to regenerate based on the characteristics of the clock signal measured by the signal measurement device, a clock generation device which generates a clock with a clock frequency determined by the clock determination device, and an image signal recovery device which recovers the image signal output from the image signal receiving device, in synchronization with the clock signal generated by the clock generation device.

Furthermore, the image signal transmission section of the invention may employ a digital transmission method in order to keep degradation of the original signal to a minimum during multi-stage transmission, thereby minimizing signal degradation from the second transmission stage onward.

Since the present invention comprises; a clock replacing section which switches the clock signal, which is based on the synchronization signal corresponding with the image signal output from the image signal receiving section, to a replacement clock signal which is generated internally, and recovers the input image signal using the replacement clock signal, and an image signal transmission section which converts the recovered image signal output from the clock replacement section to a digital transmission signal and then outputs the signal, the present invention demonstrates the following effects, namely: the construction can be simplified; jitter does not increase even if image signal repeater apparatuses are connected in multiple stages; it is possible to receive image signals having a variety of frequencies; and it is possible to transmit a good quality image signal, with minimum degradation of the original image signal.

BRIEF DESCRIPTION OF THE DRAWINGS

FIG. 1 shows the basic outline of a typical image display system used in the present invention and background art to transmit image signals over long distances.

FIG. 2 is a block diagram showing the internal structure of an image signal repeater apparatus 13 according to a first aspect of the invention as shown in FIG. 1.

FIG. 3A is a diagram showing an example of a control method for determining a clock signal to be generated internally in a signal determination device 24 shown in FIG. 2, and also showing the received signal.

FIG. 3B is a diagram showing an example of a control method for determining a clock signal to be generated internally in a signal determination device 24 shown in FIG. 2, and also showing the image signal after clock conversion (after clock replacing).

FIG. 4 is a block diagram showing an example of the internal structure of an image signal recovery device 26 shown in FIG. 2.

FIG. 5 is a block diagram showing the construction of an image signal repeater apparatus 13 according to a second aspect of the invention.

FIG. 6 is a block diagram showing in detail the internal structure of an image signal recovery device 53 shown in FIG. 5.

FIG. 7 is a block diagram showing the construction of an image signal repeater apparatus 13 according to a third aspect of the invention.

DESCRIPTION OF THE PREFERRED EMBODIMENTS

Figure 8:
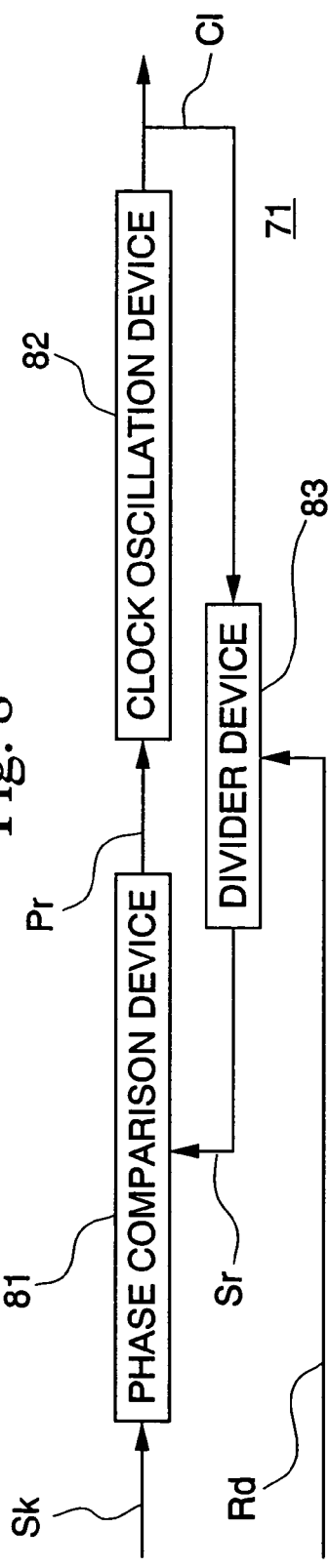
FIG. 8 is a block diagram showing in detail an example of the internal structure of a clock generation device 71 shown in FIG. 7.

As follows is a description of several embodiments of an image signal repeater apparatus and image signal display apparatus of the present invention, with reference to the drawings.

Embodiment 1 (construction and Operation)

FIG. 1 shows the basic outline of an image display system according to a first embodiment of the invention. In FIG. 1, this image display system comprises an image signal generator 11, an image signal generation device 12, and either one or a plurality of image signal repeater apparatuses 13 and image display apparatuses 14. Here, as shown in the diagram, the image signal output from the image signal generator 11 proceeds via a plurality of image signal repeater apparatuses 13 to the image display apparatus 14 and is displayed.

The operation of such an image display system is as follows. The image signal generator 11 outputs the net image signal, composed of multiple frames, which is to actually be displayed on the image display section of the image display apparatus 14, and the synchronization signal which corresponds to this image signal (from this point on these output signals are referred to collectively as the composite image signal).

The composite image signal output from the image signal generator 11 is applied to the image signal repeater apparatus 13. The image signal repeater apparatus 13 generates internally a suitable clock for the received composite image signal, recovers the image signal based on the newly generated clock, and outputs the signal. If there are multiple image signal repeater apparatuses 13, each performs the same operation, eventually outputting the signal to the image display apparatus 14 connected to the final stage. The image display apparatus 14 then displays the recovered image signal received from the image signal repeater apparatus 13.

In the above example, each image signal repeater apparatus 13 may have multiple outputs. This will obviously involve the same recovered image signal being provided to a plurality of image display apparatuses.

Since the image signal generator 11 and the image display apparatus 14 in the image display system according to embodiment 1 operate in the same manner as in a conventional apparatus, a description thereof is omitted here, and the following description focuses on the image signal repeater apparatus 13, having the internal construction which characterizes the present invention, and particularly the control method of the image signal repeater apparatus 13, from when the composite image signal is received until it is output.

In other words, in step 1, the composite image signal which is in a format suitable for transmission is received from either the image signal generator 11 or another image signal repeater apparatus 13, and converted to a format which can be easily processed in the image signal repeater apparatus 13. Next, in step 2, clock replacing is realized by regenerating the image signal based on an optimal clock generated based on the results of measuring the characteristics of the received composite image signal.

Step 2 includes the following steps (a) through (d), although these are described in more detail later. First, in step (a), the frequency of the clock component of the composite image signal, or an element which allows its calculation, is measured; in step (b) the optimal clock frequency for recovering the image signal is determined from the measurement result; in step (c) the thus determined clock is generated; and in step (d) the received-image signal is recovered in synchronization with the generated clock.

In a third step the recovered image signal recovered in the second step is converted to a digital signal format suitable for transmission (a digital transmission signal), which is then output.

The first embodiment of the invention is described in more detail below, with reference to the drawings. FIG. 2 is a block diagram showing the internal structure of the image signal repeater apparatus 13 shown in FIG. 1. As shown in FIG. 2, the image signal repeater apparatus 13 comprises; an image signal input terminal 21, an image signal receiving device 22, a signal measurement device 23, a signal determination device 24, a clock generation device 25, an image signal recovery device 26, an image signal transmission device 27, and an image signal output terminal 28.

Furthermore, Di represents the composite image signal output by the image signal receiving device 22, Dr represents the recovered image signal output by an image signal recovery device 26, Rc represents the results of the signal measurement device 23, Rd represents the results of the signal determination device 24, and Cl represents the clock signal generated by the clock generation device 25 (the replacement clock signal).

In the descriptions of the various embodiments below, the image signal receiving device 22 constitutes the image signal receiving section; the signal measurement device 23, the signal determination device 24 (also 51, 72), the clock generation device 25 (also 52 and 71) and the image signal recovery device 26 (also 53) constitute the clock replacing section; and the image signal transmission device 27 constitutes the image signal transmission section.

Next, the operation of the image signal repeater apparatus 13 shown in FIG. 1 and FIG. 2 is described with reference to FIG. 1 through FIG. 4.

FIGS. 3A and 3B shows an example of a control method for determining the frequency of the clock for the signal determination device 24 shown in FIG. 2 to generate internally. FIG. 3A shows the received signal (corresponding with the composite image signal Di), and FIG. 3B shows image signal (corresponding with recovered image signal Dr) after clock conversion (clock replacing). In FIGS. 3A and 3B, the horizontal axis indicates time, and the vertical axis indicates voltage. Here a dot is a single pixel in a display, and the horizontal synchronization signal is a signal representing one line in the display. The term "number of horizontal dots to display" refers to how much time there is for the number of pixels to display in a given period. The term "total number of horizontal dots" refers to how many pixels fit into the time which constitutes a single line.

FIG. 4 is a block diagram showing an example of the internal structure of the image signal recovery device 26 shown in FIG. 2. As shown in FIG. 4, the image signal recovery device 26 comprises a memory write control device 41, a memory 42, and a memory read control device 43. Furthermore, Di represents the composite image signal received from the image signal receiving device 22, Cd represents the clock signal included in the composite image signal Di received from the image signal receiving device 22 and synchronized therewith, Cl represents the clock signal generated by the clock generation device 25, and Dr represents the recovered image signal which is synchronized with Cl.

The operation of the image signal repeater apparatus 13 is described below with reference to the drawings. As shown in FIG. 1 and FIG. 2, the composite image signal input to the image signal input terminal 21 of the image signal repeater apparatus 13 is received at the image signal receiving device 22. At this stage the composite image signal is in a format suitable for transmission, to enable transmission from the image signal generator 11 to the image signal repeater apparatus 13. Typically an analog RGB signal (Red Green Blue code) which is a combination of an analog video signal and a synchronization signal, or a serial digital signal according to the DVI (Digital Video Interface) standard is used. The image signal receiving device 22 converts the image signal received in a format suitable for transmission, to a composite image signal in a format which can be processed easily. As a format that can be processed easily, a parallel digital signal is typically used.

As the method of converting the format of a signal in the image signal receiving device 22, when the received composite image signal is an analog signal, typically an analog/digital converter circuit which includes a clock regeneration circuit such as a PLL or the like for recovering the clock signal is used, and in the case of a serial digital signal, typically there is a decoder circuit particular to the received signal, which in order to reliably recover the received signal, includes a PLL in the decode circuit which adjusts the phase of the recovery clock. Obviously, it is possible to receive signals in either analog or digital format by providing both circuits.

The composite image signal Di output from the image signal receiving device 22 is input to the signal measurement device 23 and the image signal recovery device 26 shown in FIG. 2. The signal measurement device 23 measures the frequency of the clock signal included in the received image signal, and outputs the measurement result Rc to the signal determination device 24.

In measuring with the signal measurement device 23, the frequency of the clock need not be measured directly, and instead values whereby the frequency of the clock can be determined from measurement results such as the value of the total number of horizontal dots and the horizontal frequency can be measured.

The signal determination device 24 determines the appropriate frequency for the clock generated by the clock generation device 25 based on the results Rc measured by the signal measurement device 23 and outputs the determination result Rd to the clock generation device 25. When this determination is made, the frequency of the received clock can be used as-is, or as shown in FIG. 3, the clock frequency can be lowered before transmission to the next stage, by such means as reducing the total number of horizontal dots. Since this conversion does not involve any change in the frequency of the horizontal synchronization signal, selecting a clock which results in a lower total number of horizontal dots as shown in the example in FIG. 3 is equivalent to lowering the clock frequency.

Furthermore, since the clock generation frequency range is kept narrow to ensure that clock generation in the clock generation device 25 described later is performed in a stable manner, if the received clock frequency is less than half the frequency of the upper limit frequency, a multiple frequency clock can be specified.

Furthermore, in the case where measurements whereby the frequency of the clock signal can be estimated are not made by the signal measurement device 23, then it is possible to use a method in which the clock signal is inferred based on information obtained from the signal measurement device 23, by providing a memory device in the signal determination device 24 and storing determination information in the memory device in advance. In such a case it is generally known that the determination is made from the frequency and polarity of the horizontal synchronization signal and the vertical synchronization signal.

Upon receiving the results of the signal determination device 24, the clock generation device 25 generates a clock at the specified frequency. For this purpose, an oscillator element such as a crystal oscillator may be used, or an oscillation circuit based on an RC circuit (an oscillation circuit which determines the oscillating frequency using resistors and capacitors) may be used. It is also possible to provide a frequency stabilizing device which includes a PLL, but in this case the signal is not routinely synchronized with the clock of the received image signal.

The image signal recovery device 26 synchronizes each signal in the composite image signal Di received from the image signal receiving device 22 in a format suitable for internal processing, with the exception of the clock signal, with the clock signal Cl generated in the clock generation device 25, and outputs the signals. This is described in greater detail below with reference to FIG. 4.

The composite image signal Di received by the image signal recovery device 26 is converted to a format which can be written to memory by the memory write control device 41, and written to the memory 42 in synchronization with the clock Cd which is synchronized with the composite image signal Di. The memory 42 stores the received signal, and then the memory read control device 43 reads it from memory in synchronization with the clock Cl generated by the clock generation device 25, and outputs the signal as the recovered image signal Dr. By the above operations, the received composite image signal Di is recovered as a recovered image signal synchronized with the newly generated clock Cl, thereby achieving clock replacing.

The image signal transmission device 27 converts the recovered image signal which is synchronized with the internally generated clock Cl output from the image signal recovery device 26, to a digital serial signal which is suitable for transmission, and outputs the signal. As the digital serial signal, a format conforming to the DVI standard is generally used, but digital serial signals in other formats such as LVDS (low voltage differential signaling) may also be used provided that they meet the requirements of the system. It is also possible to use a digital parallel signal capable of being processed by a circuit comprising a CMOS (complementary metal oxide semiconductor) or the like.

Operational Effects

According to the construction of the image signal repeater apparatus of embodiment 1, even if image signal repeater apparatuses 13 are connected in multiple stages as in the image display system of FIG. 1, replacing the clock with an internally generated clock prevents the jitter from accumulating, and since the clock of the received signal is identified before being replaced with a suitable clock, the system can accept a variety of signals, and since a digital signal is used as the output signal, the occurrence of signal degradation when apparatuses are connected in multiple stages can be reduced, thereby enabling transmission over long distances.

Embodiment 2 (Construction and Operation)

FIG. 5 is a block diagram showing the construction of an image signal repeater apparatus 13 according to a second embodiment of the invention. In FIG. 5, the image signal repeater apparatus 13 comprises; an image signal input terminal 21, an image signal receiving device 22, a signal measurement device 23, a signal determination device 51, a clock generation device 52, an image signal recovery device 53, an image signal transmission device 27 and an image signal output terminal 28.

Furthermore, Di represents the composite image signal output by the image signal receiving device 22, Dr represents the recovered image signal output by the image signal recovery device 53, Rc represents the results of the signal measurement device 23, Rd represents the results of the signal determination device 51, and Cl represents the clock signal generated by the clock generation device 52.

FIG. 6 is a block diagram showing in detail the internal structure of the image signal recovery device 53 shown in FIG. 5. In FIG. 6 the image signal recovery device 53 comprises; a memory write control device 41, a memory 42, a phase difference detection device 61 and a memory read control device 62. Furthermore, Di represents the composite image signal received from the image signal receiving device 22, Cd represents the clock signal included in and synchronized with the composite image signal Di received from the image signal receiving device 22, Rm represents the image signal for writing to the memory 42, Wm represents the image signal read from the memory 42, Cl represents the clock signal generated by the clock generation device 52, and Dr represents the recovered image signal which is synchronized with Cl.

Next, the operation of the second embodiment of the present invention is described with reference to FIG. 5 and FIG. 6. Since the configuration of the image display system in this embodiment is the same as in FIG. 1 as described for the first embodiment, a description thereof is omitted here. Furthermore, any description of the image signal receiving device 22 and the image signal transmission device 27 in FIG. 5 is also omitted since they are the same as in the first embodiment.

In FIG. 5, the signal measurement device 23 receives the composite image signal Di from the image signal receiving device 22, and measures the frequency of the clock signal included in the received composite image signal Di, or measures the characteristics of signals whereby the frequency of the clock can be known.

The signal determination device 51 obtains the clock frequency of the received image signal from the measurement results Rc of the signal measurement device 23 in the same way as in embodiment 1, and outputs determination results Rd which tell the later described clock generation device 52 the best frequency at which to generate the clock in order to minimize errors in the clock frequency generated by the clock generation device 52.

Upon receiving the results Rd from the signal determination device 51, the clock generation-device 52 generates a clock at the specified frequency. For this purpose an oscillator element such as a crystal oscillator may be used, or an oscillation circuit based on an RC circuit may be used. It is also possible to provide a frequency stabilizing device which includes a PLL, but in this case the signal is not even routinely synchronized with the clock of the received image signal.

The image signal recovery device 53 synchronizes each signal in the composite image signal Di received from the image signal receiving device 22 in a format suitable for internal processing, with the exception of the clock signal, with the clock signal Cl generated in the clock generation device 52, and outputs the signals. This is described in greater detail below with reference to FIG. 6.

The memory write control device 41 receives the composite image signal Di from the image signal receiving device 22, then generates and outputs the image signal Rm for writing to memory that is synchronized with the synchronized clock signal Cd included in the composite image signal Di. The memory 42 receives and stores the received image signal for writing Rm, and outputs the image signal Wm for reading from memory subject to control by the memory read control device 62.

The phase difference detection device 61 compares the phase of the image signal Rm written to memory and the image signal Wm read from memory, and outputs the signal Pd which represents the phase difference to the memory read control device 62. The phase difference detected at this time may be detected by detecting the phase difference between the write clock and the read clock, but a simpler method is to examine the phase difference in the horizontal synchronization signal which indicates that the reading and writing of one line has completed.

The memory read control device 62 receives the detected phase difference information Pd from the phase difference detection device 61, and then reads from memory in synchronization with the clock signal Cl input from the clock generation device 52. The read processing at this time is performed in accordance with the following algorithm.

The description below is for a case where the phase difference detection device 61 detects the phase difference in the horizontal synchronization signal. More precise control is required to detect the phase difference of the clock signal, although the basic principles are the same.

Since the phase difference in the horizontal synchronization signal which follows the vertical synchronization signal, as detected by the phase difference detection device 61 is the time difference which occurs in a single horizontal period, the time obtained by multiplying the difference by the total number of horizontal synchronization signals (the number of horizontal synchronization signals in a vertical synchronization period) is equivalent to the phase difference between the input synchronization signal and the output synchronization signal produced in a single vertical synchronization period. In the memory read control device 62, the final one horizontal period in each vertical period is corrected for phase difference in order to match the output vertical synchronization period to the input vertical synchronization period.

In the operation above, in order to match the output vertical synchronization period to the input vertical synchronization period, the final horizontal synchronization period of the vertical synchronization period was altered, but this correction need not necessarily be applied to the final period, and any alterations are possible provided that the overall image signal processing is not impaired. Furthermore, the adjustment need not be made only within a single horizontal period, as it is possible to realize the above effects by correcting the clock rate of the horizontal synchronization period in each horizontal period.

Operational Effects

According to the construction of the image signal repeater apparatus 13 in embodiment 2, it is possible to compensate for any discrepancy between the frequencies of the internally generated clock and the input clock automatically, eliminating the requirement for highly accurate and expensive circuitry to be used for internal clock generation, and making it possible to provide an image signal repeater apparatus 13 which can be connected in multiple stages, at low cost.

Embodiment 3 (Construction and Operation)

FIG. 7 is a block diagram showing the construction of an image signal repeater apparatus 13 according to embodiment 3 of the invention. In FIG. 7, the image signal repeater apparatus 13 comprises; an image signal input terminal 21, an image signal receiving device 22, a signal measurement device 23, a signal determination device 72, a clock generation device 71, an image signal recovery device 53, an image signal transmission device 27 and an image signal output terminal 28.

Furthermore, Di represents a composite image signal output by the image signal receiving device 22, Dr represents a recovered image signal output by the image signal recovery device 53, Rc represents the results of the signal measurement device 23, Rd represents the results of the signal determination device 72, Cl represents the clock signal generated by the clock generation device 71, and Sk represents the synchronization signal component included in the composite image signal Di.

FIG. 8 is a block diagram showing in detail an example of the internal structure of the clock generation device 71 shown in FIG. 7. In FIG. 8, the clock generation device 71 comprises; a phase comparison device 81, a clock oscillation device 82, and a divider device 83. Furthermore, Sk indicates the synchronization signal component included in the recovered image signal received from the image signal receiving device 22, Rd indicates the results of the signal determination device 72, Pr indicates the results of the phase comparison device 81, Sr indicates the quasi-synchronized signal for comparison, obtained by dividing the output clock Cl by means of the divider device 83, and Cl indicates the clock signal generated by the clock oscillation device.

Next, the operation of the third embodiment of the invention is described with reference to FIG. 7 and FIG. 8. Since the construction of the image display system in this embodiment is the same as in FIG. 1 described for embodiment 1, a description thereof is omitted. Furthermore, since each device with the exceptions of the clock generation device 71 and the signal determination device 72 in FIG. 1, is the same as in embodiment 2, descriptions are omitted here.

In FIG. 7, the signal determination device 72 determines the number of clocks in one horizontal synchronization period from the results Rc of the signal measurement device 23, and outputs the result to the clock generation device 71.

The clock generation device 71 receives the synchronization signal Sk included in the composite image signal Di. Specifically, this synchronization signal Sk includes at least a horizontal synchronization signal and a vertical synchronization signal.

As shown in FIG. 8, the received synchronization signal Sk is input to the phase comparison device 81. In the phase comparison device 81, the synchronization signal Sk and the quasi-synchronized signal for comparison Sr input from the divider device 83 are compared, and the phase difference between them is output as Pr. At this time, phase comparison is performed only within vertical blanking periods where there is no image signal, and the output Pr is set to have a meaning of no phase difference in those periods where phase comparison is not performed.

The clock oscillation device 82 performs clock oscillation by changing the oscillation frequency according to the received phase comparison results Pr. The clock oscillation device 82 operates such that if the phase comparison results Pr show that the input synchronization signal is faster, it lowers the oscillation frequency, and if the phase comparison results Pr show that the input synchronization signal is slower, it increases the oscillation frequency, and in either case outputs the generated clock signal Cl.

The divider device 83 divides the clock signal Cl generated in the clock oscillation device 82 by the horizontal total number of clocks for the results Rd determined by the signal determination device 72, and outputs the divided result as the quasi-synchronized signal Sr.

In the description above, a PLL circuit configuration was used in the clock oscillation device 82, but the clock oscillation device 82 is not limited to such a configuration, and any circuit, for example a simple reset circuit, may be used provided that the circuit configuration enables synchronization with the input synchronization signal Sk.

Operational Effects

According to the construction of the image signal repeater apparatus 13 in embodiment 3, since the frequency of the internally generated clock is generated in synchronization with the input signal, it is possible to perform automatic tracking with greater speed and accuracy, and since synchronization is established during image blanking periods, the signal is unsynchronized during image signal periods, meaning that even if jitter is present in the input signal this does not disrupt the image.

By the above operation, the output signal can be tracked to the input signal while suppressing jitter between image signal periods, and therefore an image signal repeater apparatus 13 can be provided which enables the number of stages of the image signal repeater apparatus 13 to be increased, enabling-transmission over long-distances, even in a system where the transmitted image signal can change at any time.

Embodiment 4 (Construction and Operation)

Figure 9:
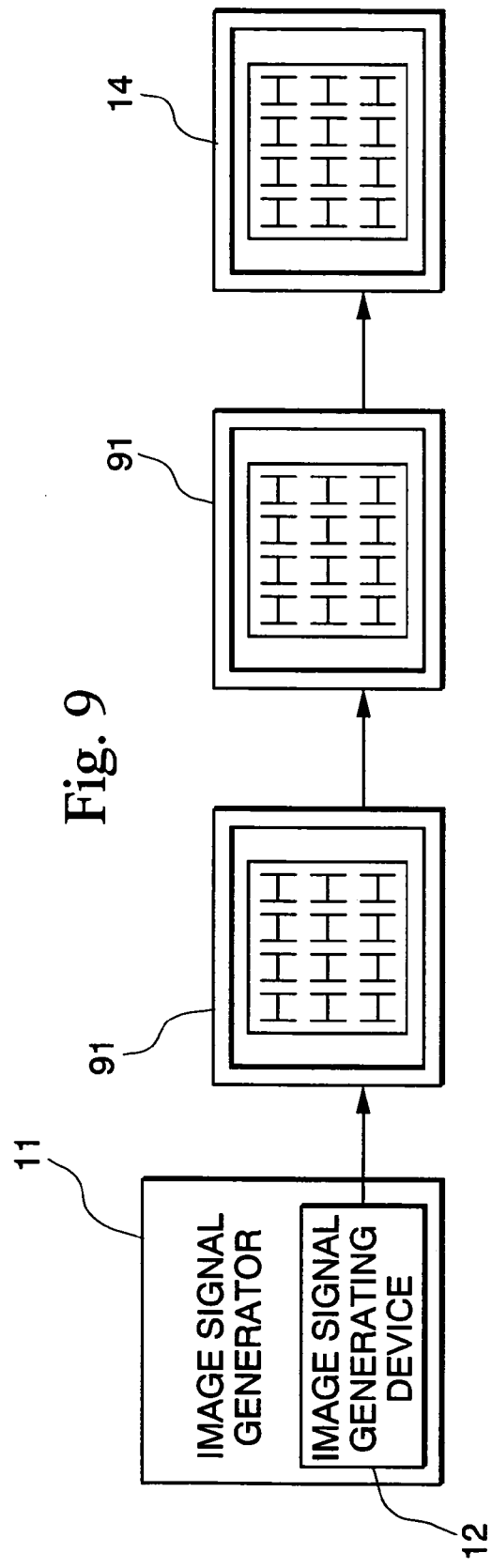
FIG. 9 is a diagram outlining an image display system according to a fourth aspect of the invention.

FIG. 9 is a diagram outlining an image display system according to embodiment 4 of the invention. In FIG. 9, this image display system comprises; an image signal generator 11, an image signal generating device 12, either one or a plurality of image display apparatuses 91, and an image display apparatus 14. Here, as shown in the diagram, the image signal output from the image signal generator 11 proceeds to the image display apparatus 14 via the plurality of image display apparatuses 91, and is displayed on each image display apparatus.

The operation of the image display system is described below. The image signal generator 11 outputs the net image signal which will actually be displayed on the image display sections of the image display apparatuses 91 and 14, and the synchronization signal corresponding to the image signal.

The composite image signal output from the image signal generator 11 is applied to the image display apparatus 91. The image display apparatus 91 generates internally a clock which is suitable for the received composite image signal, recovers the image signal based on the new clock, and outputs this as the recovered image signal, while also displaying the image signal on its own image display section. Each of the multiple image display apparatuses 91 performs the same operation, until the image signal is eventually output to the image display apparatus 14, which is the final stage. The image display apparatus 14 then displays the recovered image signal received from the image display apparatus 91.

In the example above, each image display apparatus 91 may have multiple outputs. This will obviously involve the same recovered image signal being provided to a plurality of image display apparatuses 91 or 14.

Furthermore, the final stage connected image display apparatus 14 need not be part of the system. In this case nothing is connected to the output of the final stage connected image display apparatus 91.

To elaborate, in FIG. 9 the image display apparatuses 91 alone were used to relay the image signal, but if the image display function is not required, the image signal repeater apparatus 13 as described in embodiment 1, 2 and 3 of the invention can be used, in which case the system is a mixed system using an image display apparatus 91 at those relay points where image display is required, and an image signal repeater apparatus 13 at those relay points where it is not.

Figure 10:
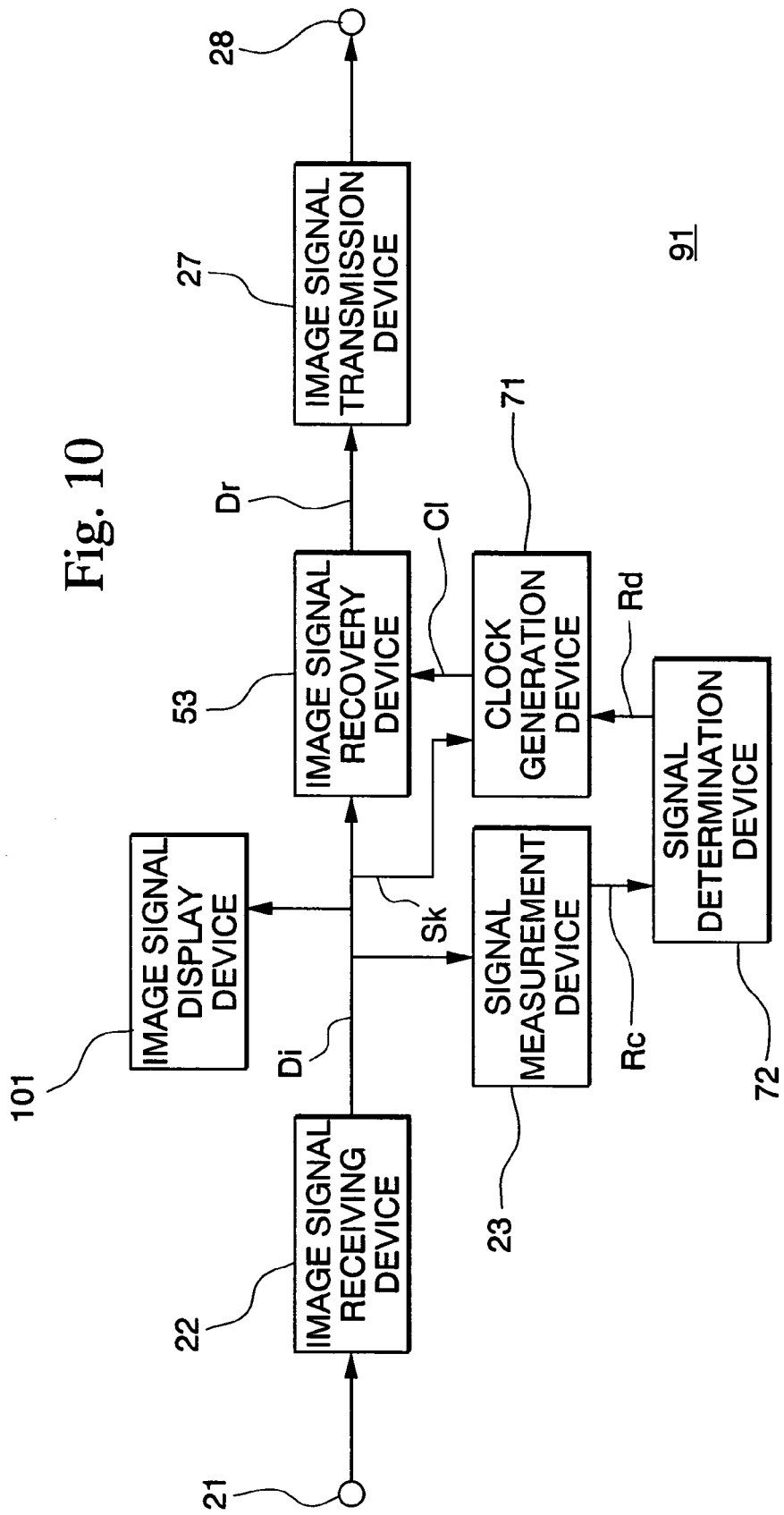
FIG. 10 is a block diagram showing the construction of an image display apparatus 91 according to the fourth aspect of the invention.
Figure 11:
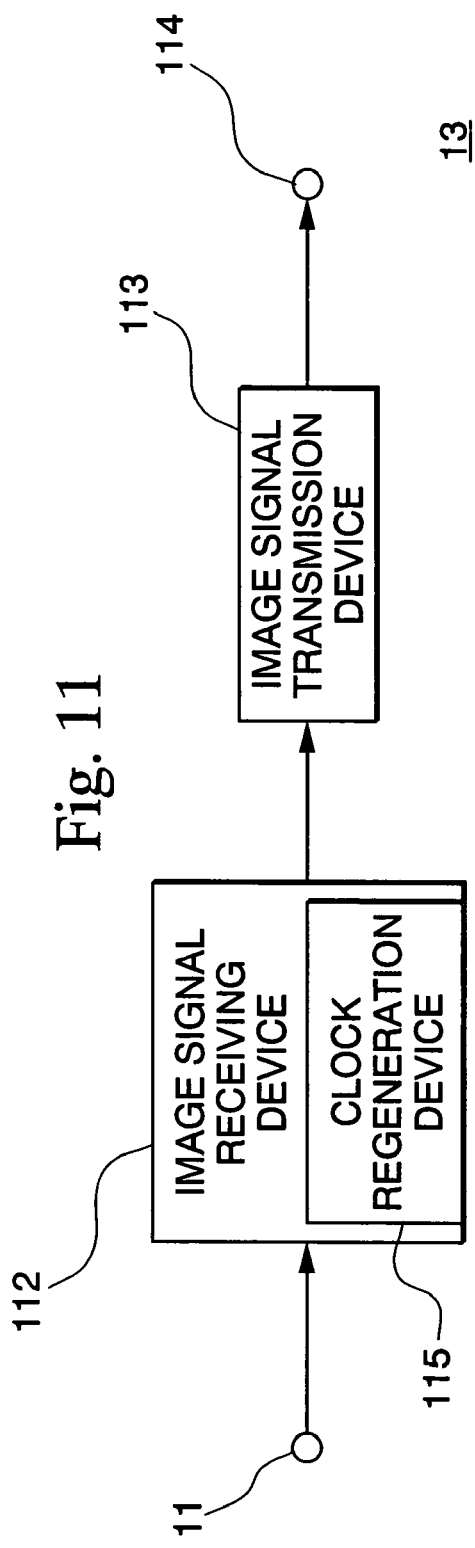
FIG. 11 is a block diagram showing the conventional internal structure of an image signal repeater apparatus 13 used in the image display system in FIG. 1.
Figure 12:
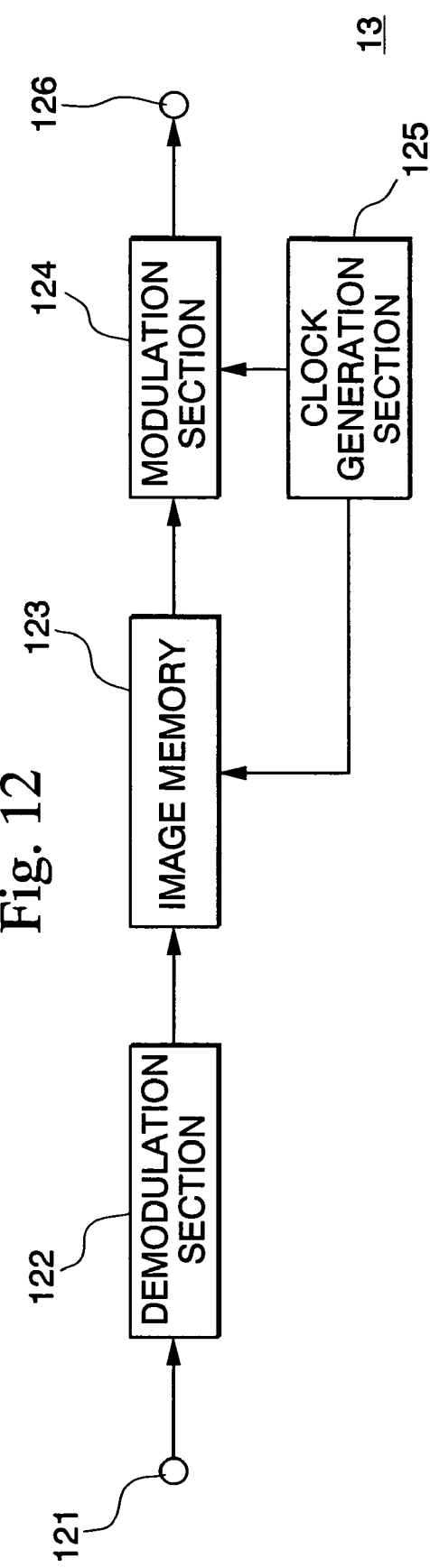
FIG. 12 is a block diagram showing only the section of the conventional repeater apparatus which is involved in relaying of the image signal.

FIG. 10 is a block diagram showing the construction of the image display apparatus 91 according to embodiment 4 of the invention. In FIG. 10, the image display apparatus 91 comprises; an image signal input terminal 21, an image signal receiving device 22, a signal measurement device 23, a signal determination device 72, a clock generation device 71, an image signal recovery device 53, an image signal transmission device 27, an image signal output terminal 28 and an image signal display device 101.

Furthermore, Di represents the composite image signal output by the image signal receiving device 22, Dr represents the recovered image signal output by the image signal recovery device 53, Rc represents the results of the signal measurement device 23, Rd represents the results of the signal determination device 72, Cl represents the clock signal generated by the clock generation device 71, and Sk represents the synchronization signal component included in the composite image signal Di.

Next, the operation of embodiment 4 of the invention is described with reference to FIG. 10. The construction of the image display system in the present embodiment is as shown in FIG. 9, and the basic operation thereof is the same as described above. Furthermore, since each device in FIG. 10 is the same as in embodiment 3, with the exception of the image signal display device 101, descriptions thereof are omitted.

The display device used in the image signal display device 101 which equates to the image display section, may be any standard display apparatus including LCD (liquid crystal displays), CRT (cathode ray tubes), PDP (plasma display panels), and EL (electroluminescent displays). Each should include the display control circuit suited to the type of display device being used.

The image signal display device 101 receives the composite image signal Di output from the image signal receiving device 22, and displays the image using the control method suited to the display device being used.

Here an example was used in which an image was displayed using the output signal from the image signal receiving device 22, but it is also possible to receive the signal from the image signal generator 11 directly from the image signal input terminal 21, or to receive the output of the image signal recovery device 53, and it is also possible to use the output signal from the image signal transmission device 27.

Furthermore, the above description assumed that the construction was the same as in embodiment 3 of the invention with the exception of the image signal display device 101, but the construction may be the same as in embodiment 1 or 2.

Operational Effects

According to the image display system of embodiment 4, even when image display apparatuses 91 which have an image signal repeater function are connected in multiple stages as shown in FIG. 9, since the clock is switched with an internally generated clock, jitter does not accumulate. Moreover, since the clock of the received signal is identified before being replaced with a suitable clock, the system can receive a variety of signals. Furthermore, since a digital signal is used as the output signal, signal degradation when apparatuses are connected in multiple stages can be reduced, thereby enabling transmission over long distances, while displaying the image at each relay point.

The embodiments of the present invention are not limited to those described above, and for example it is possible to make changes such as integrating or further separating each device in the image signal repeater apparatus 13.

What is claimed is:

1. An image signal repeater apparatus comprising:
an image signal receiving section which receives a composite image signal, comprising an image signal composed of multiple frames and a synchronization signal corresponding to said image signal, and then outputs each signal;
a clock replacing section which replaces a clock signal which is based on a synchronization signal corresponding with an image signal output by said image signal receiving section, with an internally generated replacement clock signal, and recovers an input image signal using the replacement clock signal; and
an image signal transmission section which converts the recovered image signal output from said clock replacing section, to a digital transmission signal, and outputs the converted signal.

2. An image signal repeater apparatus according to claim 1, wherein said clock replacing section comprises;
a signal measurement device which measures the characteristics of the input image signal,
a signal determination device which based on the results from said signal measurement device determines a frequency for the replacement clock signal to recover the image signal,
a clock generation device which generates a replacement clock signal for recovering the image signal according to the results of said signal determination device, and
an image signal recovery device which recovers the input image signal using the replacement clock signal generated by said clock generation device.

3. An image signal repeater apparatus according to claim 2, wherein said image signal recovery device comprises;
a memory device which stores an image signal,
a memory write device which writes the image signal to said memory device in synchronization with a clock signal which is based on the synchronization signal corresponding with the image signal, and
a memory read device which reads the image signal from said memory device in synchronization with a replacement clock signal generated by said clock generation device.

4. An image signal repeater apparatus according to claim 3, wherein a reduction in a dot clock is realized by reducing a total number of dots when read from memory relative to a total number of horizontal dots when written to memory by said image signal recovery device.

5. An image signal repeater apparatus according to claim 1, wherein said clock replacing section comprises;
a signal measurement device which measures the characteristics of the input image signal,
a signal determination device which based on the results from said signal measurement device determines the frequency of a replacement clock signal for recovering the image signal,
a clock generation device which generates a replacement clock signal for image signal recovery according to the results of said signal determination device,
an image signal recovery device which recovers an input image signal using the replacement clock generated by said clock generation device, and
a phase difference detection device which detects a phase difference between the input image signal and the recovered image signal, and outputs a control signal corresponding to the phase difference.

6. An image signal repeater apparatus according to claim 5, which controls based on the results of said phase difference detection section so as to reduce the phase difference, by adjusting the total number of horizontal dots or the total number of vertical lines so as to eliminate any generated phase difference.

7. An image signal repeater apparatus according to claim 2, wherein said clock generation device comprises:
a phase comparison device which compares a phase of the input synchronization signal and a phase of a signal corresponding to the replacement clock signal;
a clock oscillation device which oscillates the replacement clock signal produced in accordance with the results of said phase comparison device; and
a frequency dividing device which divides the replacement clock signal generated in said clock oscillation device and transmits the result to said phase comparison device,
and phase comparison is only performed by said phase comparison device within blanking periods, where there is no image data.

8. A method of controlling the image signal repeater apparatus according to claim 2, wherein said clock generation device comprises:
a phase comparison device which compares a phase of the input synchronization signal and a phase of a signal corresponding to the replacement clock signal;
a clock oscillation device which oscillates the replacement clock signal produced in accordance with the results of said phase comparison device; and
a frequency dividing device which divides the replacement clock signal generated in said clock oscillation device and transmits the result to said phase comparison device,
and phase comparison is only performed by said phase comparison device within blanking periods, where there is no image data.

9. An image display apparatus comprising:
an image signal receiving section which receives a composite image signal, comprising an image signal composed of multiple frames and a synchronization signal corresponding to said image signal, and then outputs each signal;
a clock replacing section which replaces a clock signal which is based on a synchronization signal corresponding with an image signal output by said image signal receiving section, with an internally generated replacement clock signal, and recovers an input image signal using the replacement clock signal;
an image signal display section which displays the image signal output from said clock replacing section, on an image display device, and an image signal transmission section which converts the recovered image signal output from said clock replacing section, to a digital transmission signal, and outputs the converted signal.

10. An image display apparatus according to claim 9, wherein said clock replacing section comprises;
   a signal measurement device which measures the characteristics of the input image signal,
   a signal determination device which based on the results from said signal measurement device determines a frequency for the replacement clock signal to recover the image signal,
   a clock generation device which generates a replacement clock signal for recovering the image signal according to the results of said signal determination device, and
   an image signal recovery device which recovers the input image signal using the replacement clock signal generated by said clock generation device.

11. An image display apparatus according to claim 10, wherein said image signal recovery device comprises;
   a memory device which stores an image signal,
   a memory write device which writes the image signal to said memory device in synchronization with a clock signal which is based on the synchronization signal corresponding with the image signal, and
   a memory read device which reads the image signal from said memory device in synchronization with a replacement clock signal generated by said clock generation device.

12. A method of controlling the image display apparatus according to claim 11, wherein a reduction in a dot clock is realized by reducing a total number of dots when read from memory relative to a total number of horizontal dots when written to memory by said image signal recovery device.

13. An image display apparatus according to claim 9, wherein said clock replacing section comprises;
   a signal measurement device which measures the characteristics of the input image signal,
   a signal determination device which based on the results from said signal measurement device determines the frequency of a replacement clock signal for recovering the image signal,
   a clock generation device which generates a replacement clock signal for image signal recovery according to the results of said signal determination device,
   an image signal recovery device which recovers an input image signal using the replacement clock generated by said clock generation device, and
   a phase difference detection device which detects a phase difference between the input image signal and the recovered image signal, and outputs a control signal corresponding to the phase difference.

14. A method of controlling the image display apparatus according to claim 13, which controls based on the results of said phase difference detection section so as to reduce the phase difference, by adjusting the total number of horizontal dots or the total number of vertical lines so as to eliminate any generated phase difference.

15. An image display apparatus according to claim 10, wherein said clock generation device comprises:
   a phase comparison device which compares a phase of the input synchronization signal and a phase of a signal corresponding to the replacement clock signal;
   a clock oscillation device which oscillates the replacement clock signal produced in accordance with the results of said phase comparison device; and
   a frequency dividing device which divides the replacement clock signal generated in said clock oscillation device and transmits the result to said phase comparison device,
   and phase comparison is only performed by said phase comparison device within blanking periods, where there is no image data.

16. A method of controlling the image display apparatus according to claim 10, wherein said clock generation device comprises:
   a phase comparison device which compares a phase of the input synchronization signal and a phase of a signal corresponding to the replacement clock signal;
   a clock oscillation device which oscillates the replacement clock signal produced in accordance with the results of said phase comparison device; and
   a frequency dividing device which divides the replacement clock signal generated in said clock oscillation device and transmits the result to said phase comparison device,
   and phase comparison is only performed by said phase comparison device within blanking periods, where there is no image data.

* * * * *